United States Patent [19]

Blonder et al.

[11] Patent Number: 4,914,667

[45] Date of Patent: Apr. 3, 1990

[54] HYBRID LASER FOR OPTICAL COMMUNICATIONS, AND TRANSMITTER, SYSTEM, AND METHOD

[75] Inventors: Greg E. Blonder, Maplewood; Charles H. Henry, Skillman; Rudolf F. Kazarinov, Martinsville; Nils A. Olsson, Summit; Kenneth J. Orlowsky, Middlesex, all of N.J.

[73] Assignee: American Telephone and Telegraph Company, AT&T Bell Laboratories, Murray Hill, N.J.

[21] Appl. No.: 358,468

[22] Filed: May 30, 1989

Related U.S. Application Data

[63] Continuation of Ser. No. 5,672, Jan. 21, 1987, abandoned.

[51] Int. Cl.$^4$ ............................................. H01S 3/19
[52] U.S. Cl. ........................................ 372/44; 372/36; 372/50; 372/96; 372/99; 357/81
[58] Field of Search ...................... 372/43, 44, 50, 34, 372/36, 99, 96; 357/81

[56] References Cited

U.S. PATENT DOCUMENTS

| | | | |
|---|---|---|---|
| 3,760,292 | 9/1973 | Kogelnik et al. | 331/94.5 C |
| 3,868,589 | 2/1975 | Wang | 331/94.5 |
| 4,156,206 | 5/1979 | Comerford et al. | 372/36 |
| 4,286,838 | 9/1981 | Huignard et al. | 350/96.11 |
| 4,464,762 | 8/1984 | Furuya | 372/50 |
| 4,658,403 | 4/1987 | Takiguchi et al. | 372/46 |

FOREIGN PATENT DOCUMENTS 0006372 1/1980 European Pat. Off. ............. 372/50

OTHER PUBLICATIONS

"GaInAsP/InP Integrated Laser with Butt-jointed Built-in Distributed-Bragg-reflection Waveguide", *Electronics Letters*, vol. 17, 1981, pp. 945–947, by Y. Abe et al.

"Single-wavelength Operation of the Hybrid-external Bragg-reflector-waveguide Laser Under Dynamic Conditions", *Applied Physics Letters*, vol. 47, 1985, pp. 183–185, by J. M. Hammer et al.

"Channelled-substrate Buried-heterostructure In-GaAsP/InP Laser with Semi-Insulating OMVPE Base Structure and LPE Regrowth", *Electronics Letters*, vol. 22, pp. 869–870, by D. P. Wilt et al.

*Primary Examiner*—William L. Sikes
*Assistant Examiner*—Georgie Y. Epps
*Attorney, Agent, or Firm*—Peter Businger

[57] ABSTRACT

In the interest of ease of manufacture, hybrid lasers of distributed-Bragg-reflector type are preferred for use as light sources in optical communications. Such lasers are made to operate away from mode instabilities by adjusting a laser parameter such as, e.g., laser temperature, thereby assuring highly error-free transmission. Alternatively, by suitable design of the Bragg reflector it is possible to render mode instability of negligible influence on error rate.

41 Claims, 6 Drawing Sheets

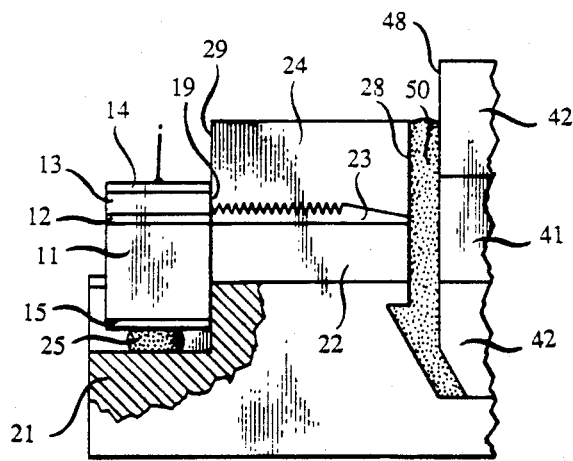
FIG. 3
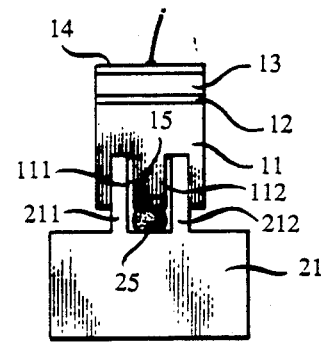
FIG. 4
FIG. 5
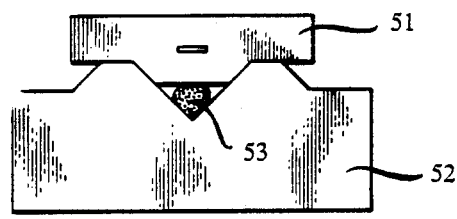

HYBRID LASER FOR OPTICAL COMMUNICATIONS, AND TRANSMITTER, SYSTEM, AND METHOD

This application is a continuation of application Ser. No. 005,672, filed on Jan. 21, 1987 now abandoned.

TECHNICAL FIELD

The invention is concerned with optical communications and, more specifically, with optical communications involving a laser light source.

BACKGROUND OF THE INVENTION

Communications technology based on the use of optical radiation as an information carrier medium has rapidly reached a point of large-scale commercial utilization, augmenting and often supplanting more traditional approaches based on wire or microwaves. Commercial viability of optical communications may be attributed to the convergence of a number of developments such as, most prominently, the perfection of low-loss optical fibers, of light sources in the form of semiconductor light-emitting diodes and lasers, and of high-speed photodetectors. Particular attention is paid in the following to laser light sources and their suitability for use in optical communications systems.

Prominent among communications lasers are those commonly designated as distributed-feedback (DFB) lasers as predicted on feedback induced by periodic variations in optical characteristics along an active medium. In this respect see, e.g., U.S. Pat. No. 3,760,292, issued Sept. 18, 1973 to H. W. Kogelnik et al., and U.S. Pat. No 3,868,589, issued Feb. 25, 1975 to S. Wang. In an alternative laser design, a structure of periodic variations of optical properties (e.g., in the form of a grating) is placed beyond rather than alongside an active medium, thereby acting as a Bragg reflector. For example, as disclosed in U.S. Pat. No. 4,386,838, issued Sept. 1, 1981 to J. P. Huignard, a device may include a semiconductor active portion which is optically coupled to a polymeric reflector portion. Or, as disclosed in U.S. Pat. No. 4,464,762, issued Aug. 7, 1984 to K. Furuya, a silicon dielectric compound is suitable for the fabrication of a distributed Bragg reflector (DBR) coupled to a semiconductor active medium.

Preferably, as disclosed by Y. Abe et al., "GaInAsP-/InP Integrated Laser with Butt-jointed Built-in Distributed-Bragg-reflection Waveguide", *Electronics Letters*, Vol. 17 (1981), pp. 945–947, field profiles and refractive indices of the active and reflector portions are matched in the interest of providing good coupling and low interface reflectivity.

Suitability of a laser for communications purposes depends on a number of criteria such as, e.g., significant suppression of nonlasing modes; in this respect see, e.g., J. M. Hammer et al., "Single-wavelength Operation of the Hybrid-external-Bragg-reflector-waveguide Laser Under Dynamic Conditions", *Applied Physics Letters*, Vol. 47 (1985), pp. 183–185. Among other requirements for optical communications are narrow linewidth for coherent applications, low chirp when dispersive transmission media are employed, and precisely selected wavelength in wavelength-multiplexed systems.

SUMMARY OF THE INVENTION

From the point of view of ease of manufacture there are distinct advantages in assembling lasers by combining a separately manufactured reflector portion with an active, amplifying portion. Such lasers, conveniently designed as hybrid distributed-Bragg-reflector lasers, are contrasted with distributed-feedback lasers as well as with monolithic distributed-Bragg-reflector lasers as made by layer deposition on a single substrate. Accordingly, hybrid distributed-Bragg-reflector lasers deserve particular consideration for communications use.

In accordance with the invention it has been discovered that hybrid distributed-Bragg-reflector lasers may undergo mode instabilities which, unless prevented or rendered harmless, adversely affect transmission error rate. In accordance with a first preferred embodiment of the invention, mode instabilities are prevented by suitable setting of a laser operating parameter such as, e.g., laser temperature. In accordance with a second preferred embodiment of the invention, mode instabilities are rendered harmless by using a sufficiently broadband Bragg reflector.

In the latter approach, laser operating point can change from one mode to a neighboring mode. This approach is of particular interest where mode dispersion is of limited concern such as, e.g., in cases of transmission over short distances (as, e.g., in local-area-network applications), or of transmission by means of optical fiber waveguides near the zero-dispersion point. The former, single-mode approach has the further advantages of providing for narrow linewidth and low chirp.

Hybrid distributed-Bragg-reflector lasers in accordance with the invention can be implemented using a dielectric reflector component such as, e.g., a silica-silicon nitride waveguide on a silicon substrate.

BRIEF DESCRIPTION OF THE DRAWING

FIG. 3 is a schematic, greatly enlarged view of an alternative to the embodiment of a distributed-Bragg-reflector-laser assembly of FIG. 1, the laser being bonded to a silicon substrate;

FIG. 4 is a schematic cross-sectional view of the active-layer portion of the laser assembly shown in FIG. 3;

FIG. 5 is a schematic cross-sectional view of a laser-active portion aligned on a V-grooved substrate;

DETAILED DESCRIPTION

Figure 1:
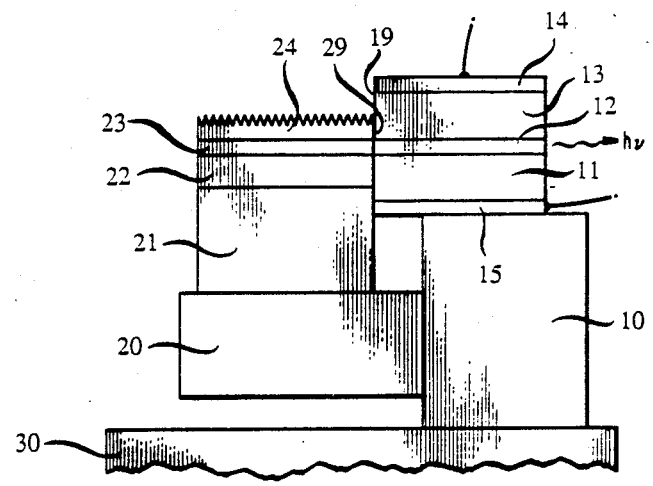
FIG. 1 is a schematic, greatly enlarged side view of a distributed-Bragg-reflector-laser assembly, representing a preferred embodiment of the invention.

FIG. 1 shows substrate 11 supporting laser active layer 12, such substrate typically including a buffer layer. FIG. 1 further shows upper cladding layer 13, and contact layers 14 and 15 with soldered electrical wire connections. Contact layer 15 also is in physical contact with submount 10 which, in turn, is attached to thermoelectric cooler 30.

Shown further is a Bragg reflector comprising substrate 21, cladding layers 22 and 24, and waveguide layer 23; the free surface of cladding layer 24 is shown bearing a diffraction grating which, during laser operation, serves as a Bragg-reflection element. Alternatively, a diffraction grating may be present, e.g., at the interface of layers 23 and 24, or at the interface of layers 23 and 22. Other buried-grating arrangements are not precluded. The Bragg reflector and the laser-active portion are shown having respective facets 29 and 19 in a facing relationship.

Substrate 21 is attached to submount 20 which in turn is attached to submount 10. Cooler (or heater) 30 serves to control laser temperature, thereby influencing the laser operating point; influence is the stronger the more diverse the materials of the laser active component and the Bragg-reflector component of a hybrid assembly. Excellent control is obtained, e.g., when Group III–V materials are used for the former, and silicon-based dielectric materials for the latter. As an alternative to temperature control of an entire laser assembly, heating or cooling may be applied selectively, e.g., to the laser-active portion alone, or to the Bragg-reflector portion alone.

Preferably, in the interest of minimizing Fabry-Perot modes and interface reflections, an anti-reflection coating is applied to facet 19 of the laser-active portion. Such a coating may be applied also to facet 29 of the Bragg-reflector portion.

Typical material compositions are n-doped indium phosphide for substrate 11, n-doped indium gallium arsenide phosphide for the active layer 12, and p-doped indium gallium arsenide phosphide for the upper cladding layer 13. Conveniently, the reflector substrate 21 is made of silicon, and the cladding layer 22 of oxidized silicon. Preferred thickness of layer 22 is sufficient to essentially prevent leakage of the optical field into the silicon substrate; a thickness of approximately 6 micrometers is adequate in this respect. Typical materials for the reflector waveguide layer 23 are silicon nitride or phosphosilicate glass, and silica glass for the cladding layer 24. The submounts 10 and 20 are made of a material having high thermal conductivity. Particularly suitable in this respect are silicon and beryllium oxide.

Figure 2:
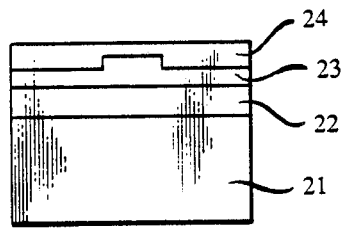
FIG. 2 is a schematic cross-sectional view of the Bragg-reflector portion of the laser assembly shown in FIG. 1.

FIG. 2 shows layers 21, 22, 23, and 24 as described above in connection with FIG. 1. Waveguide layer 23 is shown as having rib structure. Typical waveguide layer thickness is approximately 120 nanometers as measured under the rib, and approximately 110 nanometers to both sides of the rib. The width of the rib may be approximately 3 micrometers. (Such rib structure is conveniently made by deposition of a 120-nanometer layer, followed by etching of a mesa in the presence of a photodefined mask covering the rib.) Layer 22 may have a thickness of approximately 5 micrometers, and layer 24 a thickness of 0.3 to 0.8 micrometer.

FIG. 3 and 4 show a distributed-Bragg-reflector laser having a reflector portion and a laser-active portion as described above in connection with FIG. 1 and 2. However, now the laser-active portion is attached to silicon substrate 21 which, via solder 25, and due to its high thermal conductivity, also serves as a heat sink.

An optical fiber having a core portion 41 and a cladding portion 42 is shown aligned with the Bragg-reflector portion, alignment between the fiber and the laser being facilitated by placement of the fiber in a selectively etched V-groove in the substrate. Selective surface etching also facilitates alignment of the laser-active portion with the reflector portion; here, matching is between rails 211 and 212 on substrate 21, and grooves 111 and 112 in the laser substrate 11. As shown, both vertical and lateral alignment is achieved by selectively etched rail and groove surface features, and the remaining degree of freedom can be used for butting the laser-active portion against the Bragg-reflector portion. For a survey of applicable silicon etching technology see, e.g., K. E. Petersen, "Silicon as a Mechanical Material", *Proceedings of the IEEE*, Vol. 70 (1982), pp. 420–457.

Alignment resulting from matched, selectively etched features is applicable also when a laser-active portion first is attached to a silicon submount, followed by positioning of such submount relative to a Bragg-reflector portion. This approach may be used with laser-active portions mounted "junction-down"; in this respect see, e.g., Y. Seiwa et al., "High Power CW Operation over 400 mW on Five-stripe Phase-locked Laser Arrays Assembled by New Junction Down Mounting", *Journal of Applied Physics*, Vol. 61 (1987), pp. 440–442.

Waveguide 23 is shown having an optionally tapered portion extending beyond the reflector grating; such tapered portion can serve to broaden an optical mode for ready coupling into the optical fiber. Further in the interest of good coupling and minimized reflection at the laser-fiber interface, the gap between reflector facet 28 and fiber facet 48 preferably is filled with an index-matching medium 50 such as, e.g., an epoxy whose refractive index is closely matched to the refractive indices of the laser and fiber waveguide materials. Use of such a medium is particularly advantageous for minimizing the optical effects of unavoidable surface roughness at the etched reflector surface 28. Since efficacy of such a medium depends on a close match between the refractive indices of laser waveguide material and, typically, silica fiber material, choice of silicon-based dielectric materials for Bragg reflectors is particularly advantageous.

FIG. 5 shows alignment of a laser-active portion 51 by means of a V-groove surface feature of silicon substrate 52, with solder 53 used for contact. This represents an alternative to the grooves-and-rails approach of FIG. 4, also providing for lateral as well as vertical alignment.

Figure 6:
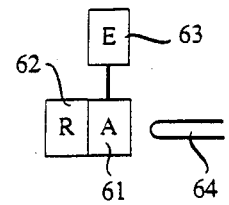
FIG. 6 is a schematic representation of a transmitter for optical communications in accordance with the invention.

FIG. 6 shows distributed-Bragg-reflector-laser active portion 61, reflector portion 62, and electronic unit 63 connected to laser active portion 61, representing a transmitter in accordance with the invention. As shown, lasers of the invention are particularly suited for direct electrical modulation; however, use of an optical modulator external to the laser is not precluded. Coupling to an optical fiber 64 may be at the laser-active portion as shown, or else at the reflector portion as shown in FIG. 3.

Figure 7:
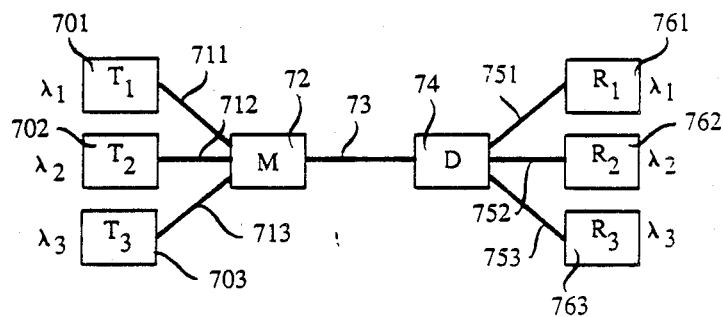
FIG. 7 is a schematic representation of a system for optical communications in accordance with the invention.

FIG. 7 shows transmitters 701, 702, and 703 for operation at respective wavelengths $\lambda_1$, $\lambda_2$, and $\lambda_3$. Optical fibers 711, 712, and 713 connect transmitters 701, 702, and 703 to multiplexer 72 to which optical transmission line 73 is connected. Transmission line 73 is connected also to demultiplexer 74 which, under operating conditions, separates signals at wavelengths $\lambda_1$, $\lambda_2$, and $\lambda_3$ for further transmission over optical fibers 741, 752, and 753 to respective receivers 761, 762, and 763. Since hybrid distributed-Bragg-reflector lasers are readily manufactured to small wavelength tolerances, such lasers are particularly suited for use in wavelength-multiplexed systems where closely-spaced channels at specified wavelengths are called for.

Figure 8:
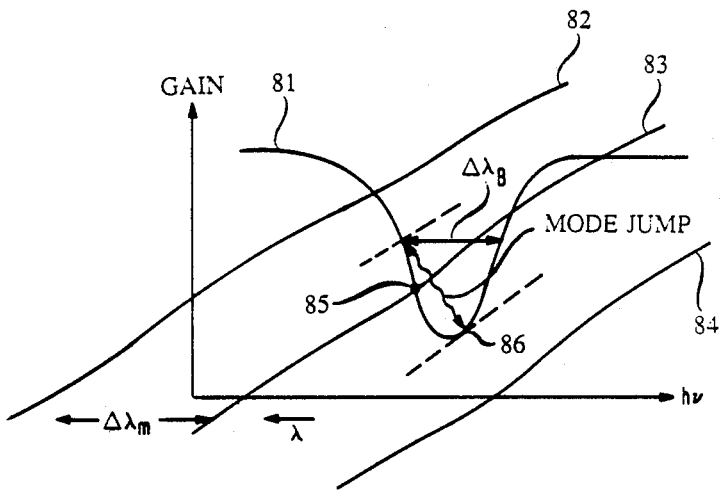
FIG. 8 is a gain-versus-optical-frequency diagram as applicable to a first preferred embodiment of the invention.

FIG. 8 shows a curve 81 corresponding to gain-equals-loss in a first preferred embodiment of the invention. (The pronounced dip in curve 81 is caused by the presence of a Bragg reflector, in whose absence the curve would be flat. The Bragg width $\Delta\lambda_B$ is directly related to the coupling strength of the grating.) Also shown are phase curves 82, 83, and 84 corresponding to round trip phase of $2\pi N$, $2\pi(N+1)$, and $2\pi(N+2)$, where N denotes an integer. (The longer the laser-active region, the closer the spacing of these curves.)

Since, in a hybrid laser under consideration, the refractive index of a laser-active medium typically has greater temperature dependence than the refractive index of the reflector medium, temperature changes lead to changes in the position of curves 82, 83, and 84 relative to curve 81, resulting in a change of operating point. If temperature changes by a sufficient amount (in the case of the laser of Examples 1 and 2 below by approximately 14 degrees C.), the laser operating point jumps from one of the curves 82, 83, and 84 to another, and mode instability is observed. The operating point is also influenced by changes in mechanical alignment of laser components, and there may be other influences in long-term operation.

In accordance with a first preferred embodiment of the invention, the Bragg width $\Delta\lambda_B$ is less than the mode spacing $\Delta\lambda_m$ of the laser-active portion, and a laser operating parameter is chosen, once or repeatedly, so as to result in a preferred laser operating point 85 away from the point 86 corresponding to mode instability. Preferably in this case, mode spacing is less than 90 percent of the Bragg width.

Figure 9:
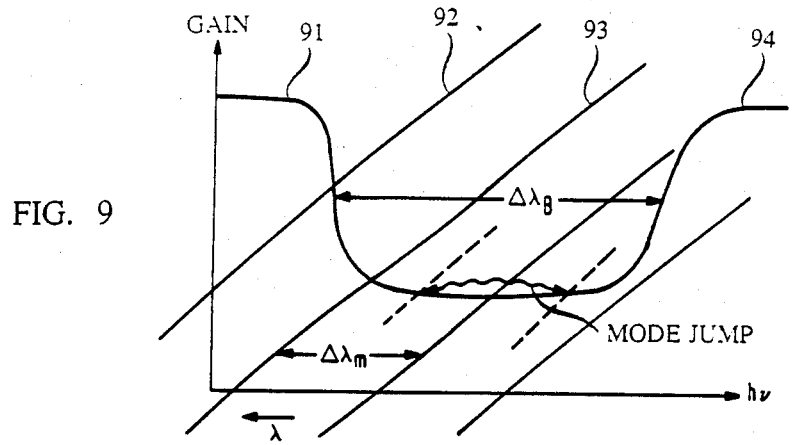
FIG. 9 is a gain-versus-optical-frequency diagram as applicable to a second preferred embodiment of the invention.

FIG. 9 shows a curve 91 corresponding to gain-equals-loss in a second preferred embodiment of the invention, as well as phase curves 92, 93, and 94 corresponding to round trip phase of $2\pi N$, $2\pi(N+1)$, and $2\pi(N+2)$. In accordance with this embodiment of the invention, the Bragg width $\Delta\lambda_B$ is greater than the mode spacing $\Delta\lambda_m$, and mode transitions do not result in significant gain changes. Preferred Bragg width is at least 1.1, and preferably at least 2 times (but not more than 4 times) mode spacing.

This second preferred embodiment of the invention is of interest especially for communications applications where narrow linewidth and frequency stability are less critical. Low transmission error rate is obtained even though laser operation involves mode instability, provided the Bragg-reflector grating is made to have a broad reflection spectrum.

Figure 10:
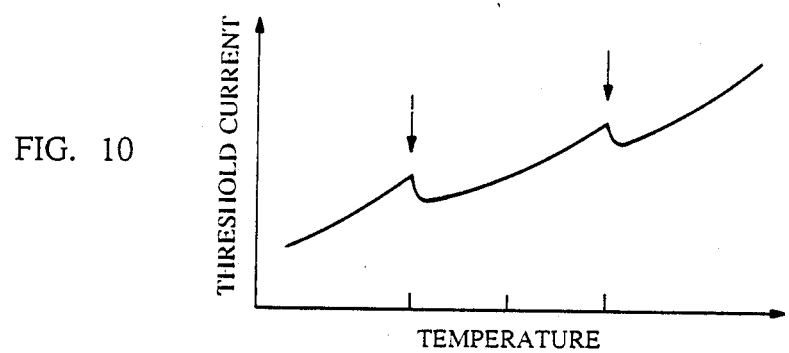
FIG. 10 is a schematic diagram showing a curve corresponding to threshold current as a function of laser temperature, such curve being helpful for determining a preferred laser parameter in accordance with a first preferred embodiment of the invention.

FIG. 10 illustrates determination of a preferred laser temperature in accordance with the first preferred embodiment of the invention on the basis of measurement of threshold current as a function of temperature. The curve of FIG. 10 can be seen to have cusps—which were found to correspond to points of mode instability. Based on such curve, a laser operating temperature can be selected away from instabilities, e.g., at or near the midpoint between cusps. (Alternatively, mode instabilities can be determined by spectral analysis of laser output.) Instead of controlling laser-temperature over-all, it is also possible to control the temperature of selected laser portions such as, e.g., the laser-active medium or the Bragg-reflector waveguide.

A similar curve can be obtained, e.g., when the independent variable is a voltage which influences the refractive index of a liquid-crystal material in contact with the Bragg-reflector grating or, possibly, of an electro-optic material. The operating point of a laser can be affected also by the distance between the laser-active portion and the Bragg-reflector portion. Further of interest in this respect is a Bragg-reflector element including a semiconductor material whose refractive index depends on carrier density as influenced by current injection.

Figure 11:
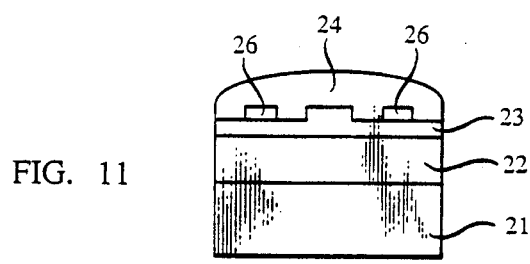
FIG. 11 is a schematic cross-sectional view of the Bragg-reflector portion of an embodiment of the invention, including heating means and an additional material for controlling a laser operating parameter.

As shown in FIG. 11, control of a laser operating parameter may involve temperature control of an auxiliary medium in contact with the Bragg-reflector grating. The cross-sectional structure shown in FIG. 11 is similar to that of FIG. 2, except that the material of layer 24 is chosen to exhibit strong changes in refractive index as a function of temperature. Chromium heater strips 26 are included to control the temperature of medium 24, thereby affecting the operating point of the laser. Transparent silicone rubber such as, e.g., Dow-Corning 684 represents a particularly effective material choice for layer 24. As an alternative to the arrangement shown in FIG. 11, a heater can be mounted on a separate substrate and placed separate from layer 23, with the space between the heater and layer 23 filled with material 24.

Furthermore, a material 24, may be chosen such that, in combination with the material of waveguide layer 23, the optical properties of the Bragg-reflector grating and the wavelength of the Bragg resonance are rendered essentially temperature-insensitive, so that temperature changes do not lead to changes in laser operating point. This aspect may be of particular advantage in coherent communications systems.

Figure 12:
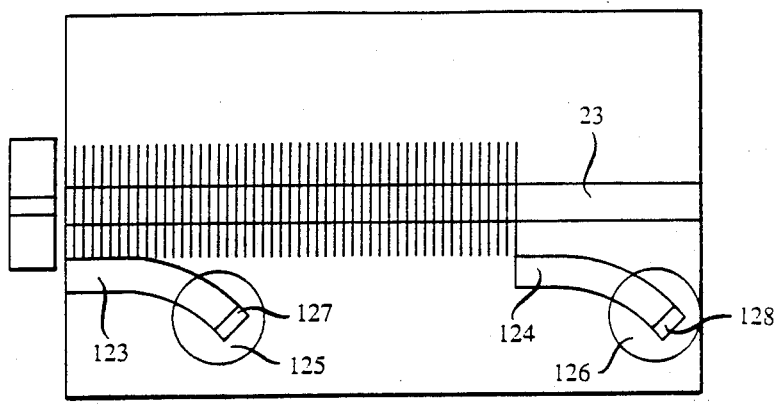
FIG. 12 is a schematic top view of a Bragg-reflector portion including optical taps as can be used for continuous setting of a laser operating parameter.

While methods for determining a laser parameter such as, e.g., laser temperature as described above in connection with FIG. 10 are best suited for use prior to laser installation, it is also possible to control a laser parameter in the course of actual laser operation. This may involve continuous or periodic monitoring and may involve the use of optical taps for measuring the power of radiation entering into and transmitted by a Bragg reflector. Such taps are shown in FIG. 12 where waveguides 123 and 124 with reflecting regions 127 and 128 couple light from a Bragg-reflector waveguide 23 into detectors 125 and 126. By controlling a laser operating parameter so as to keep the power ration essentially constant, a laser may be operated free of mode instabilities. Monitoring may be applied also to power reflected by a Bragg reflector. On account of narrow linewidth and low chirp, single-mode lasers obtained by choice of operating point away from mode instabilities as described above are particularly suited for transmission over dispersive waveguides and for coherent systems.

EXAMPLE 1.

Figure 13:
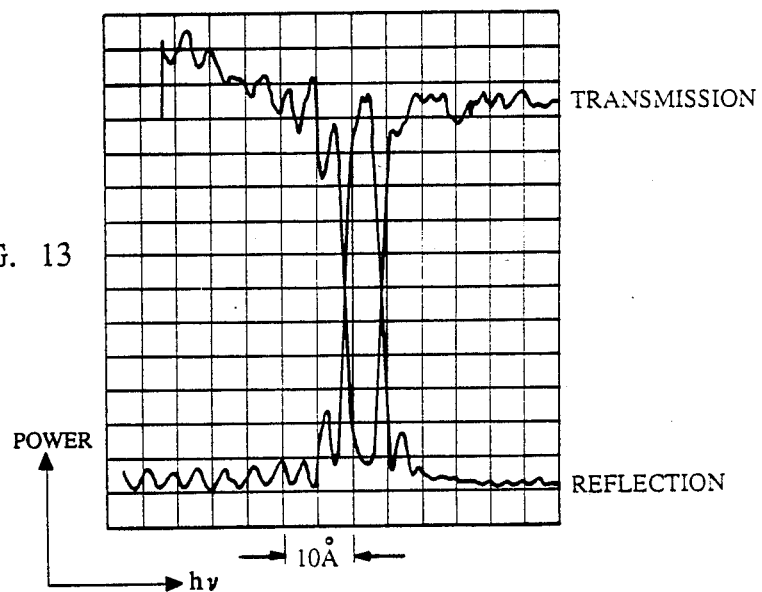
FIG. 13 is a diagram based on measurements carried out on a Bragg-reflector chip as may be incorporated in a device in accordance with the invention, such diagram showing transmission and reflection curves for such reflector chip.

A Bragg reflector was made on a silicon chip by standard chemical-vapor-deposition (CVD) processing and photodefined etching of a rib waveguide, such Bragg reflector being as shown in FIG. 1 and 2. The length of the reflector was approximately 5 mm. A reflector grating, having a period of approximately 0.5 micrometer for first-order Bragg reflection, was formed by holographic lithography and etched into the silica glass cladding layer. The spectral properties of the silicon-chip Bragg reflector were measured by transmission of white light and by reflection and transmission of tunable F-center laser light; a typical transmission-and-reflection spectrum is shown in FIG. 13. The Bragg line was found to be approximately 6 Angstroms wide and to be centered at 15182 Angstroms.

A standard channeled-substrate buried-heterostructure laser as described by D. P. Wilt et al., "Channelled-substrate Buried-heterostructure InGaAsP/InP Laser with Semi-insulating OMVPE Base Structure and LPE Regrowth", Electronics Letters, Vol. 22, pp. 869–870 was butt-coupled to the silicon-chip Bragg reflector; no anti-reflection coating was applied. Threshold current of the laser was found to be approximately 21 mA. (Without external feedback, threshold current was approximately 25 mA, and it is estimated that power coupling efficiency between the laser and the reflector waveguide was approximately 20 percent.) A continuous-wave spectrum of the laser was recorded at a laser current of approximately 100 mA, and the mode-suppression ratio was found to be greater than 5000 to 1.

Figure 14:
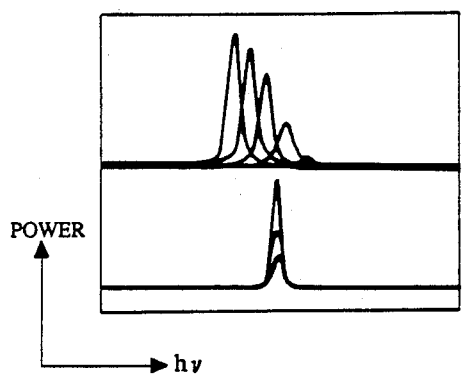
FIG. 14 is a diagram showing lasing spectra as experimentally determined for a laser in accordance with the invention and, for sake of comparison, for a laser without a Bragg-reflector grating. The diagram shows laser output power as a function of laser frequency for different laser drive currents under direct-current operating conditions.

The wavelength chirping characteristics of the laser were investigated with and without the external feedback. For this purpose, spectra were recorded as the laser drive current was increased in steps of 5 mA; see FIG. 14, bottom portion for spectra obtained with external feedback, and top portion without external feedback. As can be seen from FIG. 14, top portion, the lasing wavelength of each of the lasing modes shifts approximately 0.05 Angstrom/mA or 0.65 gigahertz/mA. By contrast, as can be seen from FIG. 14, bottom portion, this shift is less than 0.03 gigahertz/mA in the presence of external feedback.

Figure 15:
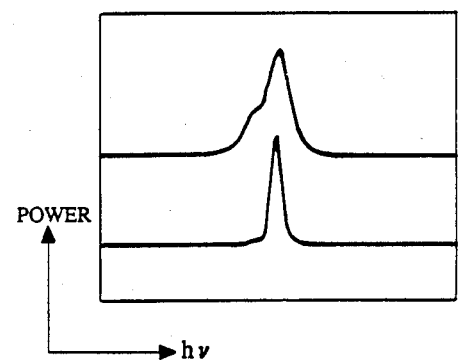
FIG. 15 is a diagram showing a lasing spectrum as experimentally determined for a laser in accordance with the invention and, for the sake of comparison, for a laser without a Bragg-reflector grating. The diagram shows laser output power as a function of laser frequency under conditions of modulation with a 1-gigahertz signal.

1-GHz chip of the laser when modulated with a 45-mA peak-to-peak signal is shown in FIG. 15. It can be seen that dynamic linewidth is reduced from approximately 0.75 Angstrom (top portion of FIG. 15) to less than approximately 0.2 Angstrom (bottom portion of FIG. 15) upon attachment of the external reflector.

Figure 16:
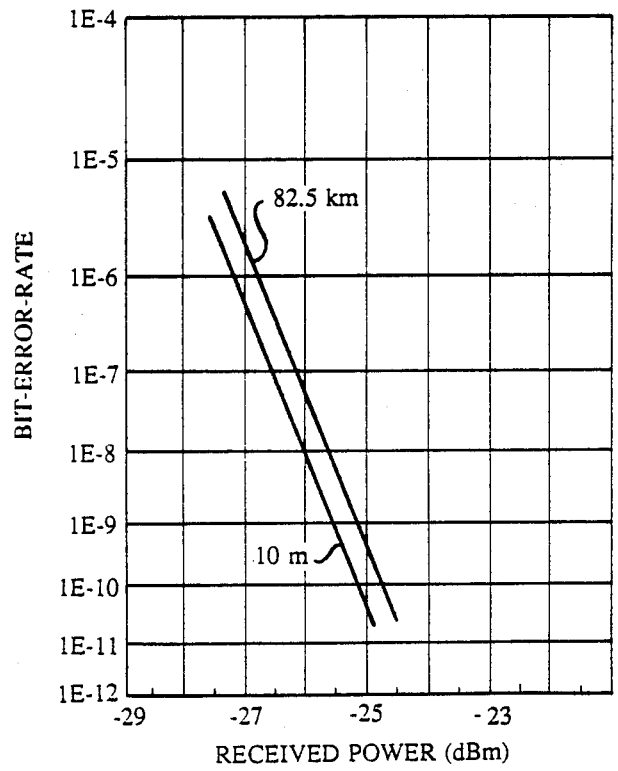
FIG. 16 is a plot of bit error rate as a function of received power as experimentally determined using a transmitter in accordance with the invention for transmission at 1.7 gigabits per second over a dispersive fiber for distances of 10 meters and 82.5 kilometers, transmission being at a wavelength of approximately 1.52 micrometer, and the zero-dispersion point of the fiber being at approximately 1.3 micrometer.

To verify stable, single-longitudinal-mode operation and low-chirp performance of the laser, a transmission experiment was carried out at a bit rate of 1.7 Gbit/s lengths of 10 m and of 82.5 km of optical fiber. A receiver consisting of an InGaAs avalanche photodiode was used, coupled directly to the 50-ohm input of a commercial high-speed amplifier. The laser was modulated with a 45-mA peak-to peak non-return-to-zero $2^{15}-1$ pseudo-random data signal. As shown in FIG. 16, a received power of approximately $-25.2$ dBm was required to realize a bit-error rate no exceeding $10^{-9}$ in the case of transmission over 82.5 km. With the laser under the same modulation conditions, but with only 10 m of fiber, a power of approximately $-25.6$ dBm was required for the same bit-error rate; this indicates a dispersion penalty of not more than approximately 0.4 dB.

EXAMPLE 2.

A laser was made as described above, except that reflector breadth was approximately 25 Angstroms as contrasted with 6 Angstroms in Example 1. Laser operation over a wide temperature range was normally single-mode, and occasionally dual-mode. Laser amplitude was observed to vary smoothly through transitions between single- and dual-mode operation, with at most 10 percent amplitude variation during transitions. Error rate experiments were performed, and the power penalty during mode transition was found not to exceed approximately 0.5 dB.

What is claimed is:

1. An optical communications laser comprising a first element and a second element, said first element comprising an active layer and a cladding layer supported by a first substrate, said cladding layer being adjacent to said active layer, and said first element further comprising electrode means for supplying an electrical current to said active layer, said second element comprising a grating structure on a second substrate, said second element being aligned with respect to said first element such that light emitted by said active layer is diffracted by a grating in said grating structure, said grating structure thereby serving in forming an optical cavity, said laser being designed for operation at a desired operating point which depends on a laser parameter, the setting of said laser parameter being significantly different from a first value and from a second value, said first and second values being values at which said laser undergoes node instability, said first value being the value at which said laser undergoes mode instability nearest to and less than said setting, and said second value being the value at which said laser undergoes mode instability nearest to and greater than said setting.

2. The laser of claim 1, said setting being half-way between said first value and said second value.

3. The laser of claim 1, said parameter being laser temperature, and said laser comprising means for controlling the temperature of at least a portion of said laser.

4. The laser of claim 1, said parameter being first-element temperature, and said laser comprising means for controlling the temperature of said first element.

5. The laser of claim 1, said parameter being second-element temperature, and said laser comprising means for controlling the temperature of said second element.

6. The laser of claim 1, said first substrate being attached to said second substrate.

7. The laser of claim 1, said first substrate consisting essentially of a Group III-V material.

8. The laser of claim 1, said second substrate consisting essentially of silicon.

9. The laser of claim 8, said second element comprising a silicon-based dielectric core region.

10. The laser of claim 9, said core region being between cladding regions which comprise silicon dioxide.

11. The laser of claim 1, said second element comprising radiation monitoring means for monitoring optical power at a point of said second element.

12. The laser of claim 1, said monitoring means comprising optical taps.

13. The laser of claim 11, said monitoring means comprising means for monitoring optical power entering said second element and for monitoring optical power transmitted by said second element.

14. The laser of claim 11, said monitoring means comprising means for monitoring optical power reflected by said second element.

15. The laser of claim 11, said second substrate being aligned relative to said first substrate by means of selectively etched surface features.

16. The laser of claim 6, comprising a solder connection between said first substrate and said second substrate.

17. The laser of claim 1, said grating structure comprising a buried grating.

18. The laser of claim 1, comprising a medium adjacent to the grating in said grating structure, and means for affecting the temperature of said medium.

19. The laser of claim 18, said medium comprising silicon rubber.

20. The laser of claim 1, comprising a medium adjacent to the grating in said grating structure, said medium being selected to render laser operating point essentially independent of temperature.

21. The laser of claim 1, said second element comprising a tapered waveguide in alignment with the direction of laser output radiation.

22. The laser of claim 1, said first element being attached to a submount which is attached to said second substrate.

23. The laser of claim 22, said submount being aligned relative to said second substrate by selectively etched surface features.

24. An optical communications laser comprising a first element and a second element,
said first element comprising an active layer and a cladding layer supported by a first substrate, said cladding layer being adjacent to said active layer, and said first element further comprising electrode means for supplying an electrical current to said active layer,
said second element comprising a grating structure on a second substrate,
said second element being aligned with respect to said first element such that light emitted by said active layer is diffracted by a grating in said grating structure, said grating structure thereby serving in forming an optical cavity,
said second element supporting at least two modes of optical radiation.

25. The laser of claim 24, said first substrate being attached to said second substrate.

26. The laser of claim 24, said first substrate consisting essentially of a Group III-V material.

27. The laser of claim 24, said second substrate consisting essentially of silicon.

28. The laser of claim 27, said second element comprising a silicon-based dielectric core region.

29. The laser of claim 28, said core region being between cladding regions which comprise silicon dioxide.

30. The laser of claim 25, said second substrate being aligned relative to said first substrate by means of selectively etched surface features.

31. The laser of claim 25, comprising a solder connection between said first substrate and said second substrate.

32. The laser of claim 24, said grating structure comprising a buried grating.

33. The laser of claim 24, said second element comprising a tapered waveguide in alignment with the direction of laser output radiation.

34. The laser of claim 24, said first element being attached to a submount which is attached to said second substrate.

35. The laser of claim 34, said submount being aligned relative to said second substrate by selectively etched surface features.

36. An optical transmitter comprising an optical communications laser, said laser comprising a first element and a second element,
said first element comprising an active layer and a cladding layer supported by a first substrate, said cladding layer being adjacent to said active layer, and said first element further comprising electrode means for supplying an electrical current to said active layer,
said second element comprising a grating structure on a second substrate,
said second element being aligned with respect to said first element such that light emitted by said active layer is diffracted by a grating in said grating structure, said grating structure thereby serving in forming an optical cavity,
said laser being designed for operation at a desired operating point which depends on a laser parameter,
the setting of said laser parameter being significantly different from a first value and from a second value, said first and second values being valves at which said laser undergoes mode instability, said first value being the value at which said laser undergoes mode instability nearest to and less than said setting, and said second value being the value at which said laser undergoes mode instability nearest to and greater than said setting,
said transmitter comprising an optical fiber connection, and said connection comprising a selectively etched surface feature.

37. An optical transmitter comprising an optical communications laser, said laser comprising a first element and a second element, said first element comprising an active layer and a cladding layer supported by a first substrate, said cladding layer being adjacent to said active layer, and said first element further comprising electrode means for supplying an electrical current to said active layer, said second element comprising a grating structure on a second substrate, said second element being aligned with respect to said first element such that light emitted by said active layer is diffracted by a grating in said grating structure, said grating structure thereby serving in forming an optical cavity, said second element supporting at least two modes of optical radiation, said transmitter comprising an optical fiber connection, and said connection comprising a selectively etched surface feature.

38. An optical communications system comprising an optical fiber and a transmitter connected to said optical fiber, said transmitter comprising an optical communications laser, said laser comprising a first element and a second element, said first element comprising an active layer and a cladding layer supported by a first substrate, said cladding layer being adjacent to said active layer, and said first element further comprising electrode means for supplying an electrical current to said active layer, said second element comprising a grating structure on a second substrate, said second element being aligned with respect to said first element such that light emitted by said active layer is diffracted by a grating in said grating structure, said grating structure thereby serving in forming an optical cavity, said laser being designed for operation at a desired operating point which depends on a laser parameter, the setting of said laser parameter being significantly different from a first value and from a second value, said first and second values being values at which said laser undergoes mode instability, said first value being the value at which said laser undergoes mode instability nearest to and less than said setting, and said second value being the value at which said laser undergoes mode instability nearest to and greater than said setting.

39. The communications system of claim 38, comprising a plurality of transmitters and wavelength multiplexer.

40. An optical communications system comprising an optical fiber and an optical transmitter connected to said optical fiber, said transmitter comprising an optical communications laser, said laser comprising a first element and a second element, said first element comprising an active layer and a cladding layer supported by a first substrate, said cladding layer being adjacent to said active layer, and said first element further comprising electrode means for supplying an electrical current to said active layer, said second element comprising a grating structure on a second substrate, said second element being aligned with respect to said first element such that light emitted by said active layer is diffracted by a grating in said grating structure, said grating structure thereby serving in forming an optical cavity, said second element supporting at least two modes of optical radiation.

41. A method for transmitting a signal, said method comprising operating an optical communications laser, said laser comprising a first element and a second element, said first element comprising an active layer and a cladding layer supported by a first substrate, said cladding layer being adjacent to said active layer, and said first element further comprising electrode means for supplying an electrical current to said active layer, said second element comprising a grating structure on a second substrate, said second element being aligned with respect to said first element such that light emitted by said active layer is diffracted by a grating in said grating structure, said grating structure thereby serving in forming an optical cavity, said laser being designed for operation at a desired operating point which depends on a laser parameter, said method comprising setting said laser parameter significantly different from a first value and from a second value, said first and second values being values at which said laser undergoes mode instability, said first value being the value at which said laser undergoes mode instability nearest to and less than said setting, and said second value being the value at which said laser undergoes mode instability nearest to and greater than said setting.

* * * * *